United States Patent
Ball et al.

(10) Patent No.: US 11,016,127 B2
(45) Date of Patent: May 25, 2021

(54) APPARATUS FOR MEASURING DC LEAKAGE CURRENT AND METHOD OF USE

(71) Applicant: Quanta Associates, L.P., Houston, TX (US)

(72) Inventors: David James Ball, Houston, TX (US); Donald William McLennan, Langley (CA)

(73) Assignee: Quanta Associates, L.P., Houston, TX (US)

( * ) Notice: Subject to any disclaimer, the term of this patent is extended or adjusted under 35 U.S.C. 154(b) by 235 days.

(21) Appl. No.: 16/377,639

(22) Filed: Apr. 8, 2019

(65) Prior Publication Data
US 2019/0257859 A1  Aug. 22, 2019

Related U.S. Application Data

(63) Continuation of application No. 15/173,072, filed on Jun. 3, 2016, now Pat. No. 10,254,316.
(Continued)

(51) Int. Cl.
*G01R 31/08* (2020.01)
*G01R 19/00* (2006.01)
(Continued)

(52) U.S. Cl.
CPC ..... *G01R 19/0092* (2013.01); *G01R 19/2513* (2013.01); *G01R 31/1245* (2013.01); *G01R 31/085* (2013.01)

(58) Field of Classification Search
CPC ............ G01R 19/0092; G01R 19/2513; G01R 31/025; G01R 31/085; G01R 31/1245; G08B 21/185
See application file for complete search history.

(56) References Cited

U.S. PATENT DOCUMENTS

| 2,319,587 A | 5/1943 | Conrad |
| 2,997,529 A | 8/1961 | Fink |

(Continued)

FOREIGN PATENT DOCUMENTS

GB  1492444 A  11/1977

OTHER PUBLICATIONS

Dick Milton, "High Voltage Live Line Working", Jan. 1, 2013 14 pages, UK Power Networks, Manchester, United Kingdom.
(Continued)

*Primary Examiner* — Minh N Tang
(74) *Attorney, Agent, or Firm* — Oathout Law Firm; Mark A. Oathout; Antony C. Edwards

(57) ABSTRACT

An apparatus and method measures and analyzes DC current passing through a substantially insulating member or dielectric material that is electrically connected to, or otherwise conductive, between an energized DC electrical transmission line and an Earth potential or ground. An apparatus may utilize a DC current measuring device, a DC voltage level selection switch, a DC display, a graphical display of momentary leakage current, and an audio speaker. A process may entail extending a substantially insulating member or dielectric material between an energized DC electrical transmission line and an Earth potential, detecting a DC momentary leakage current, using a DC momentary leakage current meter to measure DC current through the member or material, and a computer to analyze and compare the DC current, and deliver results or a warning that the DC current has reached a threshold value.

19 Claims, 10 Drawing Sheets

Related U.S. Application Data

(60) Provisional application No. 62/170,554, filed on Jun. 3, 2015.

(51) Int. Cl.
   *G01R 19/25* (2006.01)
   *G01R 31/12* (2020.01)

(56) References Cited

U.S. PATENT DOCUMENTS

| | | |
|---|---|---|
| 3,346,236 A | 10/1967 | Hubbard et al. |
| 3,514,695 A | 5/1970 | Skarshaug |
| 3,688,017 A | 8/1972 | Roots |
| 4,833,415 A * | 5/1989 | Nourai ............... G01R 31/1245 324/557 |
| 6,170,607 B1 * | 1/2001 | Freeman ............... B66C 15/065 182/18 |
| 9,535,105 B2 * | 1/2017 | Phillips .................. G01R 31/50 |

OTHER PUBLICATIONS

Guillaume Heroin et al., "Live Working, a Cutting-Edge Technique, 50 Years of French History", Apr. 1, 2014 122 pages, RTE, Paris, France.

Jedlicska, Istvan, Extended European Search Report for EP Application No. 16 80 4556, Jan. 15, 2019 12 pages, European Patent Office, Munich, Germany.

* cited by examiner

APPARATUS FOR MEASURING DC LEAKAGE CURRENT AND METHOD OF USE

CROSS-REFERENCE TO RELATED APPLICATIONS

This application claims the benefit of U.S. Provisional Application No. 62/170,554 filed on Jun. 3, 2015, and entitled Direct Current Meter And Method Of Use.

STATEMENT REGARDING FEDERALLY SPONSORED RESEARCH OR DEVELOPMENT

None.

FIELD OF THE INVENTION

This invention relates to a Direct Current (DC) meter and method of use on energized DC electrical transmission and distribution power lines.

BACKGROUND OF THE INVENTION

This section provides background information related to the present disclosure which is not necessarily prior art. Certain barehand or common potential methods of servicing live, or energized, alternating current (AC) power lines are generally known to specially-trained or skilled individuals within the electrical construction and maintenance industry. Generally, barehand and common potential maintenance methods permit maintenance on power lines to be more efficient because electrical power does not need to be shut off to, or routed around, the power line for which maintenance is to be performed. In one instance of performing maintenance on a high voltage AC power line, an aerial lift platform, such as a bucket truck, may be equipped with an insulated, extendable boom to insulate workers in the bucket from ground potential and thus any potential difference with a high voltage AC power line, with which the workers may be in common potential. In conjunction with barehand and common potential methods used on AC power lines, an AC meter may be used to monitor current that passes through the insulated, extendable boom. While using such a meter and method on an AC power line has proven satisfactory, because Direct Current (DC) high voltage and associated current behaves much differently, and an AC meter and techniques are not satisfactory for work on a DC high voltage power line, a new DC meter and method of using the DC meter are desired.

SUMMARY

An apparatus for measuring Direct Current (DC) from an energized DC electrical power line may utilize a DC current measuring device to measure a DC leakage current from the energized DC electrical power line, a DC numerical display that displays the DC leakage current measured by the DC current measuring device, and an audio speaker that sounds upon the DC current measuring device measuring a threshold DC leakage current value. An apparatus may further utilize in some combination, a manual DC voltage class selector switch that is manually adjustable to coincide with a DC voltage of the DC electrical power line, an automatic DC voltage class selector switch that automatically switches to coincide with a DC voltage of the DC electrical power line, a graphical display that visually depicts a level of the DC leakage current measured by the DC current measuring device, an aerial work platform for containing and delivering human workers to a height of an energized DC electrical power line, a chassis, such as a crane chassis, bucket truck chassis, trailer or other chassis. The apparatus may also employ an elongate electrically insulating member having an insulating member first end and an insulating member second end, the insulating member first end connected (e.g. electrically) to the chassis, and the insulating member second end connected (e.g. electrically) to the aerial work platform, a conductive lead having a conductive lead first end and a conductive lead second end, the conductive lead first end contacting the energized DC voltage transmission line, and the conductive lead second end contacting the aerial work platform. A corona ring may be attached proximate to the insulating member first end with an exterior collector band attached proximate the insulating member second end. An internal collector band may be attached proximate to the insulating member second end. A DC input lead having a DC input lead first end and a DC input lead second end may be provided with the DC input lead first end contacting the external collector band and the internal collector band. The DC input lead second end may be an electrical input for the DC measuring device. A DC ground or output lead may be provided and have a DC output lead first end and a DC output lead second end. The DC output lead first end may be attached to an electrical ground point of the DC measuring device and the second end of the DC output lead may contact an Earth ground or potential. A plurality of hydraulic lines may traverse an interior of the elongate insulating member. The hydraulic lines may be electrically connected to the DC measuring device. A plurality of fiber optic lines may traverse an interior of the elongate insulating member. The fiber optic lines may be electrically connected to the DC measuring device. A portable casing to be carried by an individual human may substantially retain the DC current measuring device, the DC numerical display, the graphical display and the audio speaker.

The apparatus and methods of any of the present teachings, may be used in conjunction with, or may include an energized DC electrical power line having a voltage between 10,000 volts and 100,000 volts, inclusive, or between 100,000 volts and 200,000 volts, inclusive, or between 200,000 volts and 300,000 volts, inclusive, or between 300,000 volts and 400,000 volts, inclusive, or a voltage between 400,000 volts and 500,000 volts, inclusive, or between 500,000 volts and 600,000 volts, inclusive.

In another example of the present teachings, a portable apparatus for use with an energized DC transmission line may utilize a substantially electrically insulating structure, a DC current measuring device to measure DC current passing through the substantially electrically insulating structure, a DC voltage level switch, a DC display to display a DC current measured by the DC current measuring device at a DC voltage level of the DC voltage level switch, a graphical display to indicate an amperage of the DC current, and an audio speaker to sound at a threshold amperage of the DC current measured by the DC current measuring device. An apparatus may further employ a casing to which the DC current measuring device, the DC voltage level switch, the digital DC display, the graphical display, and the audio speaker, attach. The apparatus may further exhibit a first end of the substantially electrically insulating structure that contacts the energized DC transmission line, and a second end of the substantially electrically insulating structure that contacts an earth ground (i.e. ground voltage, ground potential), an electrical lead having an electrical lead first end and an electrical lead second end, with the electrical lead first end fastened proximate to the second end of the insulating structure and the electrical lead second end fastened to the DC current measuring device. A portable apparatus may also employ a DC ground lead (e.g. an electrically conductive cable) having a DC ground lead first end and a DC ground lead second end, with the DC ground lead first end attached to the DC current measuring device (e.g. an electrical ground point of the DC current measuring device), and the second end of the DC ground lead contacting an Earth ground (e.g. ground voltage or ground potential). As representative examples, the substantially electrically insulating structure may be a ladder, scaffolding, a hydraulic line, a boom (e.g. a crane boom, a bucket truck boom, or an aerial platform device boom), or nearly any fiber reinforced plastic ("FRP") structure used in as an electrically insulating structure.

In another example of the present teachings, an apparatus for use with an energized DC transmission line may utilize an electrically conductive supporting structure of an energized DC electrical power line, an energized DC transmission line located between a surface of Earth and the electrically conductive supporting structure, a first elongate substantially electrically insulating structure contacting each of the electrically conductive supporting structure and the energized DC transmission line, and a DC current measuring device electrically wired in series between the first elongate substantially electrically insulating structure and an electrical ground (e.g. ground potential or ground voltage). A DC current measuring device may be electrically wired in series between the first elongate substantially electrically insulating structure, and an electrical ground may be an electrical lead having an electrical lead first end and an electrical lead second end, the electrical lead first end electrically connected to the first elongate substantially electrically insulating structure and proximate to the electrically conductive supporting structure of the energized DC electrical power line. The electrical lead second end may be fastened to the DC current measuring device. A DC ground lead having a DC ground lead first end and a DC ground lead second end, may have the DC ground lead first end attached to an electrical ground point of the DC current measuring device, and the DC ground lead second end in contact with an Earth ground (e.g. ground potential or ground voltage). The structure having Earth potential or Earth ground may be the electrically conductive supporting structure. A second elongate substantially electrically insulating structure may contact each of the electrically conductive supporting structure and the energized DC transmission line. The DC current measuring device may also be electrically connected in series to the second elongate substantially electrically insulating structure.

The DC current measuring device may be electrically connected in series to the second elongate substantially electrically insulating structure to measure a momentary leakage current passing through both the first elongate substantially electrically insulating structure and the second elongate substantially electrically insulating structure, when the first and second structures are electrically connected. The first elongate substantially electrically insulating structure and the second elongate substantially electrically insulating structure may be substantially parallel to each other, and may be in tension due to a weight of the energized DC electrical power line suspended from the elongate substantially electrically insulating structures. The apparatus may further employ a DC voltage selector switch that adjusts manually or automatically to coincide with a DC voltage level of the energized DC electrical power line, a DC numerical display that displays the DC current measured by the DC current measuring device, an audio speaker that sounds upon the DC current measuring device measuring a threshold DC current value, a graphical display that visually depicts a level of the DC leakage current measured by the DC current measuring device, and a hand-held casing to which the DC current measuring device, the DC voltage selection switch, the digital and graphical display, and the audio speaker are attached or encased.

A process of the teachings of the present invention may be providing an energized DC electrical line above an Earthen surface (i.e. a surface of the Earth), electrically connecting or electrically bonding a substantially electrically insulating structure against the energized DC electrical line and the Earthen surface (or surface with Earth potential), providing a DC current meter, in series between the insulating member and the Earthen surface, a DC current meter, and measuring a DC momentary leakage current flowing through the insulating member with the DC current meter. DC momentary leakage current is considered to be direct current that flows through, despite how relatively minuscule or not miuscule, a substantially electrically insulating structure (e.g. an FRP or fiber reinforced plastic or other material largely considered to be insulating). Measuring a DC momentary leakage current that passes through the insulating member with the DC current meter, may further entail measuring every $\frac{1}{60}^{th}$ or $\frac{1}{120}^{th}$ of a second with the DC current meter, the DC momentary leakage current flowing through the insulating member or substantially electrically insulating structure. The process may further include storing in a digital memory, a plurality of momentary leakage current values measured by the DC current meter; and comparing the plurality of momentary leakage current values measured by the DC current meter to a predetermined threshold current value indicative of a DC flashover current value for the substantially electrically insulating structure. Depending upon the comparison of the values, the process may also entail sounding an audible alarm when any of the plurality of momentary leakage current values measured by the DC current meter is larger than the predetermined threshold current value and activating a visible alarm when any of the momentary leakage current values measured by the DC current meter is larger than the predetermined threshold current value. Still yet, the process may include calculating a moving average for the plurality of momentary leakage current values, comparing the moving average to a predetermined threshold current value indicative of a DC current flashover current value for the substantially electrically insulating structure, and sounding an audible alarm when the moving average of the plurality of momentary leakage current values measured by the DC current meter is larger than the predetermined threshold current value.

In another example, a process may include providing an energized DC electrical line above a surface of the Earth, locating a first end of a substantially electrically insulating structure proximate (e.g. near enough to experience circulating current or induction current, or electrically attached with an electrically conductive jumper cable) the energized DC electrical line, locating a second end of a substantially electrically insulating structure proximate an Earthen surface, providing, in series between the insulating member and the Earthen surface, a DC current meter, and measuring a plurality of momentary leakage current values flowing through the substantially electrically insulating structure using the DC current meter. The process may further include measuring every 1/60th of a second (or other time interval), a DC momentary leakage current flowing through the substantially electrically insulating structure using the DC current meter, calculating a moving average for the plurality of momentary leakage current values, storing in a digital memory, the plurality of momentary leakage current values measured by the DC current meter, and comparing the plurality of momentary leakage current values measured by the DC current meter to a predetermined threshold current value indicative of a DC current flashover current value for the substantially electrically insulating structure, and sounding an audible alarm when any of the plurality of momentary leakage current values measured by the DC current meter is larger than the predetermined threshold current value. The process may also include activating a visible alarm when any of the plurality of momentary leakage current values flowing through the substantially electrically insulating structure measured by the DC current meter is larger than the predetermined threshold current value. The process may further include locating a first end of a substantially electrically insulating structure proximate the energized DC electrical line, electrically connecting a first end of a substantially electrically insulating structure to the energized DC electrical line and the Earthen surface. Locating a second end of a substantially electrically insulating structure proximate an Earthen surface, may further include locating a second end of a substantially electrically insulating structure proximate on a surface that has Ground potential. The process may further include calculating a moving average for the plurality of momentary leakage current values; storing in a digital memory, the plurality of momentary leakage current values measured by the DC current meter, and comparing the plurality of momentary leakage current values measured by the DC current meter to a predetermined threshold current value indicative of a DC current flashover current value for the substantially electrically insulating structure.

Calculating a moving average for the plurality of momentary leakage current values may further include calculating a moving average using a predetermined number of momentary leakage current values measured in succession by the DC current meter by excluding the first momentary leakage current value of a series of momentary leakage current values and including the next momentary leakage current value following an immediately prior subset of momentary leakage current values used to calculate an average. The process may further include sounding an audible alarm when any of the plurality of momentary leakage current values measured by the DC current meter is larger than the predetermined threshold current value. The process may further include predicting electrical flashover of the substantially electrically insulating structure from one of the momentary leakage current values that is measured by the DC current meter by comparing the DC momentary leakage current value to a predetermined threshold value indicative of a DC current flashover value of the substantially electrically insulating structure. The process may include displaying on a DC numerical display of the DC current meter, the DC momentary leakage current, sounding an audio alarm upon the DC current measuring device measuring a threshold value of the DC momentary leakage current, displaying on a graphical display, the threshold value for the substantially electrically insulating structure, and displaying on the graphical display, the DC momentary leakage current measured by the DC current meter. The substantially electrically insulating structure may be a hydraulic line, a boom, or any such structure that is made from a fiber reinforced plastic material or other insulating material.

In another example, a process may include measuring direct current (DC) through a material by providing a DC meter capable of measuring amperage at voltages of an electrically energized DC power line, providing an electrically energized DC power line to supply DC through a substantially dielectric material, measuring the DC passing through the substantially dielectric material to determine an instantaneous DC amperage value, comparing the instantaneous DC amperage value to a known DC amperage flashover value for the substantially dielectric material, and activating an alarm when the instantaneous DC amperage value is equal to or greater than the known DC amperage flashover value for the substantially dielectric material. Measuring the DC passing through the substantially dielectric material to determine an instantaneous DC amperage value, may include repeatedly measuring the DC passing through the substantially dielectric material to create a plurality of instantaneous DC amperage values, and calculating a moving average using the plurality of instantaneous DC amperage values. Activating an alarm when the instantaneous DC amperage value is equal to or greater than the known DC amperage flashover value for the substantially dielectric material may further include providing a DC portable meter, and displaying the instantaneous DC amperage value on a visible display of the DC portable meter. The electrically energized DC power line may be between 38 kV and 600 kV, inclusive.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments or examples described or illustrated. The scope of the invention is intended only to be set forth by the scope of the claims that follow. Each embodiment or example is provided by way of explanation of the invention, one of many embodiments of the invention, and the following examples should not be read to limit, or define, the scope of the invention.

Figure 1:
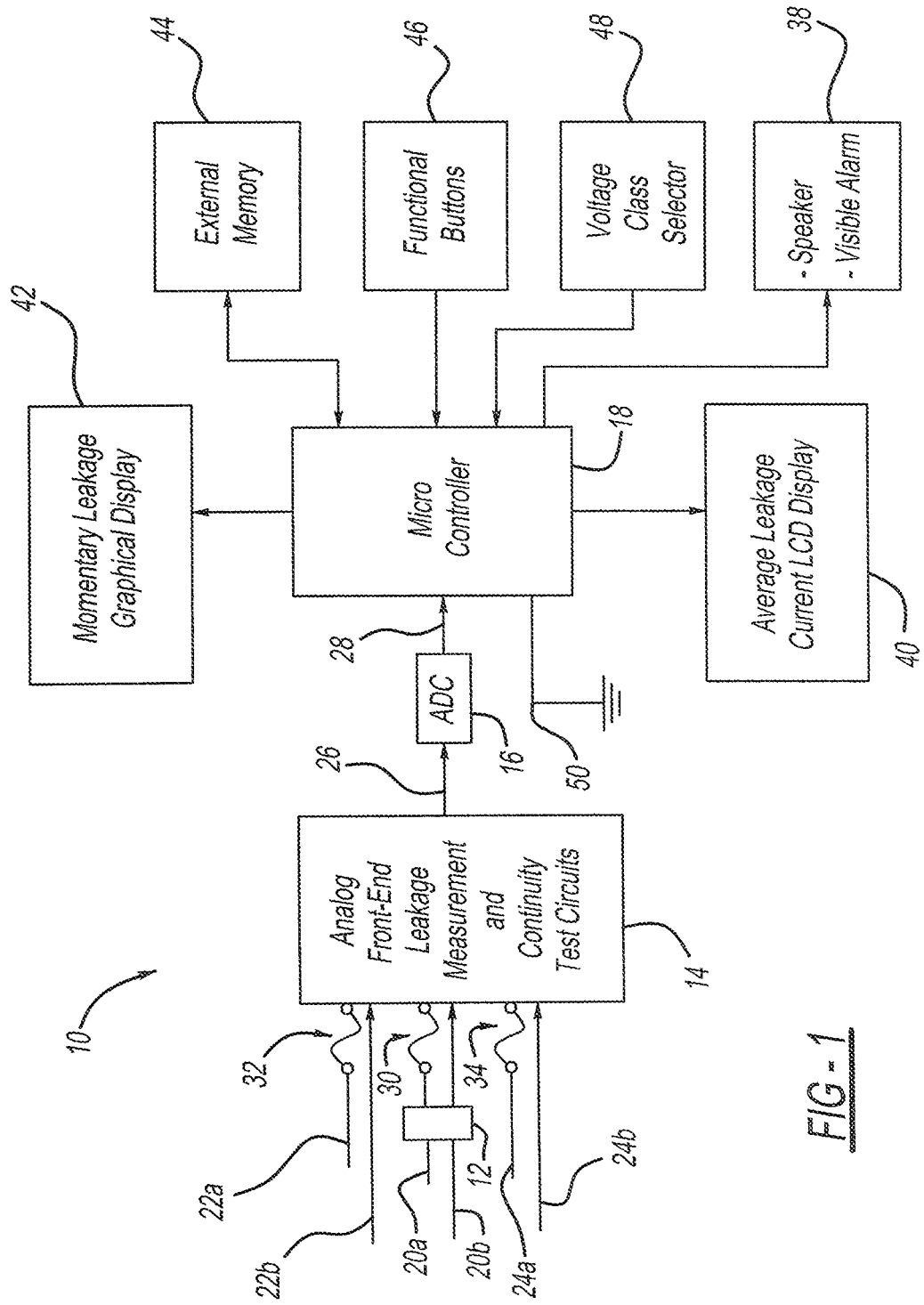
FIG. 1 is a schematic depicting internal components of a voltage meter and associated user-readable displays in accordance with teachings of the present invention.

FIG. 1 is a schematic view of components of a DC current meter 10 in accordance with teachings of the present invention. DC current meter 10 may include an electrically conductive collector 12, an analog front-end 14, which is a current receiver that receives or collects current from electrically conductive collector 12 to be measured and used as an input 26 for an analog-to-digital converter 16, also known in abbreviated form as "ADC", whose digital output signal 28 is used as an input for a micro-controller 18, which is also a computer. With reference including FIG. 5, multiple sources of electrical current to be used as input into the analog front end 14 of ADC 16 may be electrical current from a boom 20, electrical current from one or more of a type of hydraulic line 22, and electrical current from a leveling rod or one or more of a fiber optic cable 24, or both a leveling rod or one or more of a fiber optic cable 24. For example, electrical lines 20a, 20b may carry electrical current from boom 20 such that electrical line 20a may carry current from an interior surface or inside diameter surface of boom 20, and electrical line 20b may carry current from an exterior surface or outside diameter surface of boom 20, as depicted, to electrically conductive collector 12. Electrical lines 22a, 22b may each carry electrical current from a single hydraulic line 22 or one or more hydraulic lines 22 to electrically conductive collector 12. Electrical lines 24a, 24b, may each carry electrical current from fiber optic cable 24 to electrically conductive collector 12. In place of, or in additional to fiber optic cable 24, a leveling rod may conduct and carry electricity to electrically conductive collector 12. Although electric lines, fiber optic cables, hydraulic lines, and one or more leveling rods are used as specific examples of structures for which current passing through such structure may be measured, the teachings of the present disclosure may be employed to measure or monitor electrical current for any structure, which may be an insulating structure, if desired.

With reference again to FIG. 1, after electrical current from each of boom 20, hydraulic line 22, and fiber optic cable 24 passes onto or into electrically conductive collector 12, such electrical current may then pass into analog front end 14. For example, electrical current from boom 20 passes through electrical lines 20a, 20b and through a fuse 30, which is an electrical protective device to protect all electrical downstream components from a power surge, before entering analog front-end 14. Electrical current from one or more hydraulic lines 22 may pass through electrical lines 22a, 22b, and through a fuse 32, which is an electrical protective device to protect all electrical downstream components from a power surge, before entering analog front-end 14. Electrical current from one or more fiber optic cables 24 may pass through electrical lines 24a, 24b, and through a fuse 34, which is an electrical protective device to protect all electrical downstream components from a power surge, before entering analog front-end 14. Instead of a fuse 30, 32, 34 which may be a one-time-use type of device when employed for its purpose, a different device with the same current interrupting or stopping purpose may be substituted, such as a circuit breaker, which may be resettable.

Analog front end 14 measures the amperage flowing from electrical input collector 12 which is a measurement also referred to as "leakage current" because current is flowing through devices such as boom 20, hydraulic line 22, and fiber optic cable 24, which are designed and known to be insulating devices to the extent their materials permit them to be insulating or insulative given the voltage to which boom 20, hydraulic line 22, and fiber optic cable 24 that are directly or ultimately connected. Thus, any current that passes through such otherwise insulating devices is known as "leakage current" rather than simply current. Measuring of such leakage current is performed in analog front end 14, which also performs an electrical continuity test on each of any connected boom 20, hydraulic line 22, and fiber optic cable 24. Measuring current or leakage current, such as DC current, through other devices is possible by using the teachings of the present invention.

Analog front end 14 is an electrical circuit and may employ high precision shunt resistors for each channel creating a path to ground. Alternatively, a Hall effect sensor can be used instead of one or more shunt resistors. A Hall effect sensor may be arranged in any necessary position relative to the device from which to measure magnetic current. As an example, the Hall effect sensor may be arranged parallel to, or otherwise proximate to, a capacitor or other electric circuit component, with a lead to ground. The Hall effect sensor may be used to detect a magnetic field that translates to a current, such as direct current. The shunt resistors are monitored by high bandwidth and high gain amplifiers for potential difference (i.e. voltage) across them, induced by current (also known as leakage current) flowing to ground. Its resistor and amplifier design will allow for bi-directional leakage current detection for a scale of +/−0 to 500 microamperes or single-ended +/−0 to 1000 microamperes range. The output of an amplifier may be amplified again (e.g. once more) before being input into analog to digital converter 16 as input 26. The amplifier output, which is input 26, will go to analog to digital converter 16 employing a precision high-speed ADC chip. Alternatively input 26 may be directed directly to microcontroller 18 and thereby bypass a separate ADC 16 if microcontroller 18 is equipped with its own built-in ADC, which may depend upon specific application requirements. The specific application requirements that may dictate whether a separate ADC is used, or input signal 26 goes directly in microcontroller 18 may be the bandwidth of the input signal, and the accuracy and precision of the detected current. The operation or functionality is such that leakage current passing through the internal shunt resistors from the test insulation connections of the boom equipment, will create a potential difference across the resistor with reference to ground. Any analog-to-digital converter, whether it is a separate ADC outside of microcontroller 18 or within microcontroller 18, converts the analog voltage level to a digital representation, which can then be processed by microcontroller 18 to perform various outputs such as an audible trigger alarm(s) from speaker 38, a readable display on an LCD display 40, a graphical display such as a momentary leakage current graphical display 42, and then store or log all output or results to memory 44, which may be an external memory device as a separate component from microcontroller 18.

With continued reference to FIG. 1, other components of the teachings of the present invention will be explained. FIG. 1 depicts one or more function buttons 46. Function buttons may be input controls to control functions of the microcontroller in accordance with the present invention. For instance, one function may be an on and off switch to supply or electricity or power to, and prevent power or electricity from flowing to microcontroller 18. Another function button 46 may be a continuity test button, also known as a self-test button. Such a test when initiated by pressing such a button, permits the microcontroller to cause electricity to test the continuity of each of the electrical wires 20a, 20b, 22a, 22b, 24a, 24b to ensure that no electrical open circuits or breaks in continuity in any of the leakage current electrical wires 20a, 20b, 22a, 22b, 24a, 24b exists. Other functions to invoke with a function button 46 are possible. A voltage class selector 48 may function to permit a user to manually select a voltage class, range or upper limit at which a voltage meter, such as DC voltage meter 10, may properly function. Alternatively, voltage class selection may be performed automatically, and internally within DC voltage meter 10 upon DC voltage meter 10 sensing or measuring voltage. Thus, no manual voltage selection need be performed with a switch such as voltage class selector 48. Examples of voltage classes are: from 0-400 kV, 0-500 kV, and 0-600 kV. Other DC voltage classes are possible. This, in accordance with the present teachings, voltage class selector 48 could have three distinct positions, or more. A ground wire 50 that creates an electrical path to Earth permits functions, such as test functions and current monitoring within microcontroller 18, and functioning of current meter 10 itself, to properly work.

Figure 2:
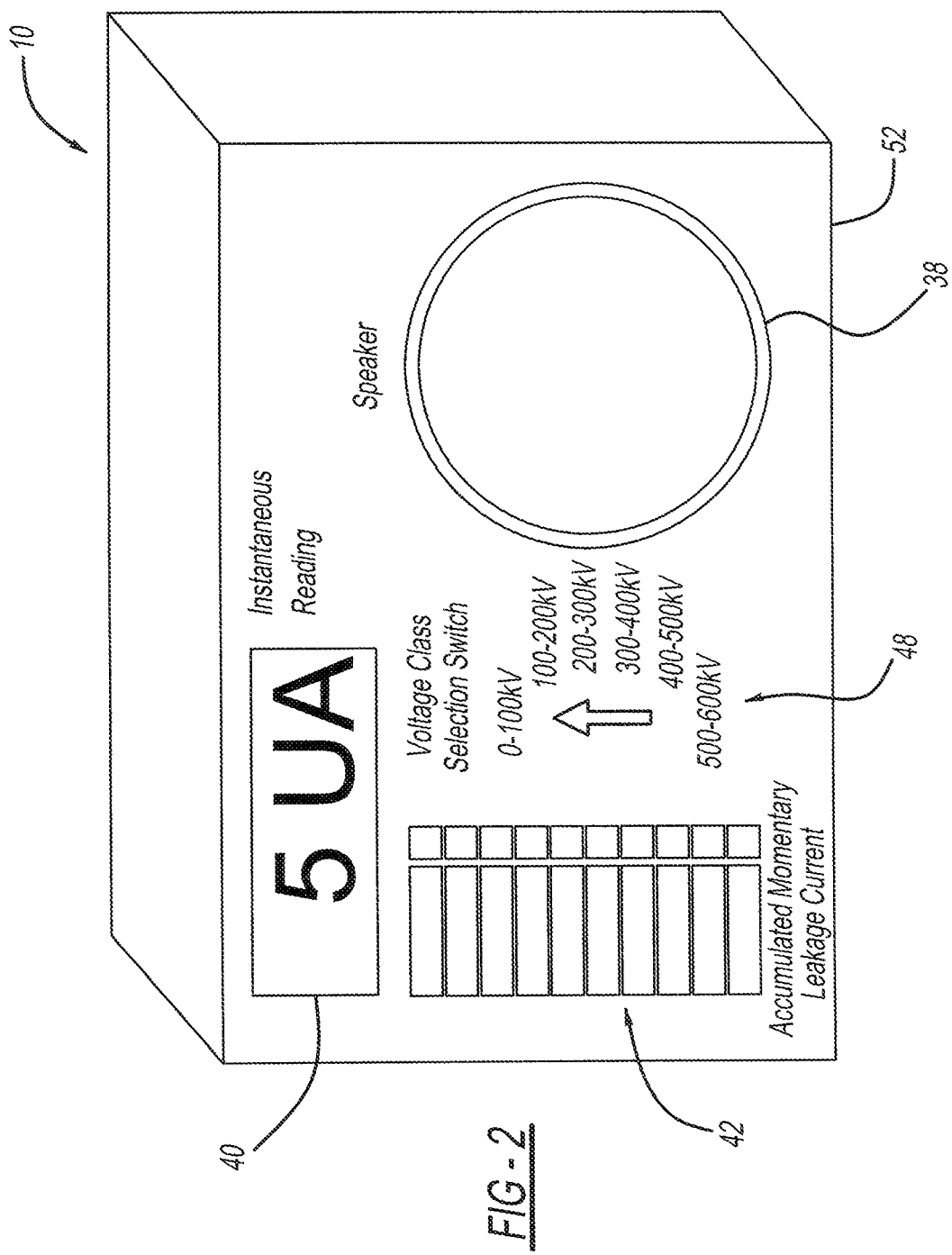
FIG. 2 is a perspective external view of a voltage meter encased within a housing to contain its operative parts and promote portability.

FIG. 2 is an external view of DC current meter 10 with most of the operative components enclosed within a casing 52. By enclosing the components of DC current meter 10 within casing 52, the portability of the teachings of the present invention are enhanced. FIG. 2 is one example of how an instantaneous reading or readout, such as an LCD display 40, an audio speaker 38, a voltage class selector switch 48 and an accumulated momentary leakage current graphical display 42, may be arranged or positioned within and around a surface of casing 52.

Figure 3:
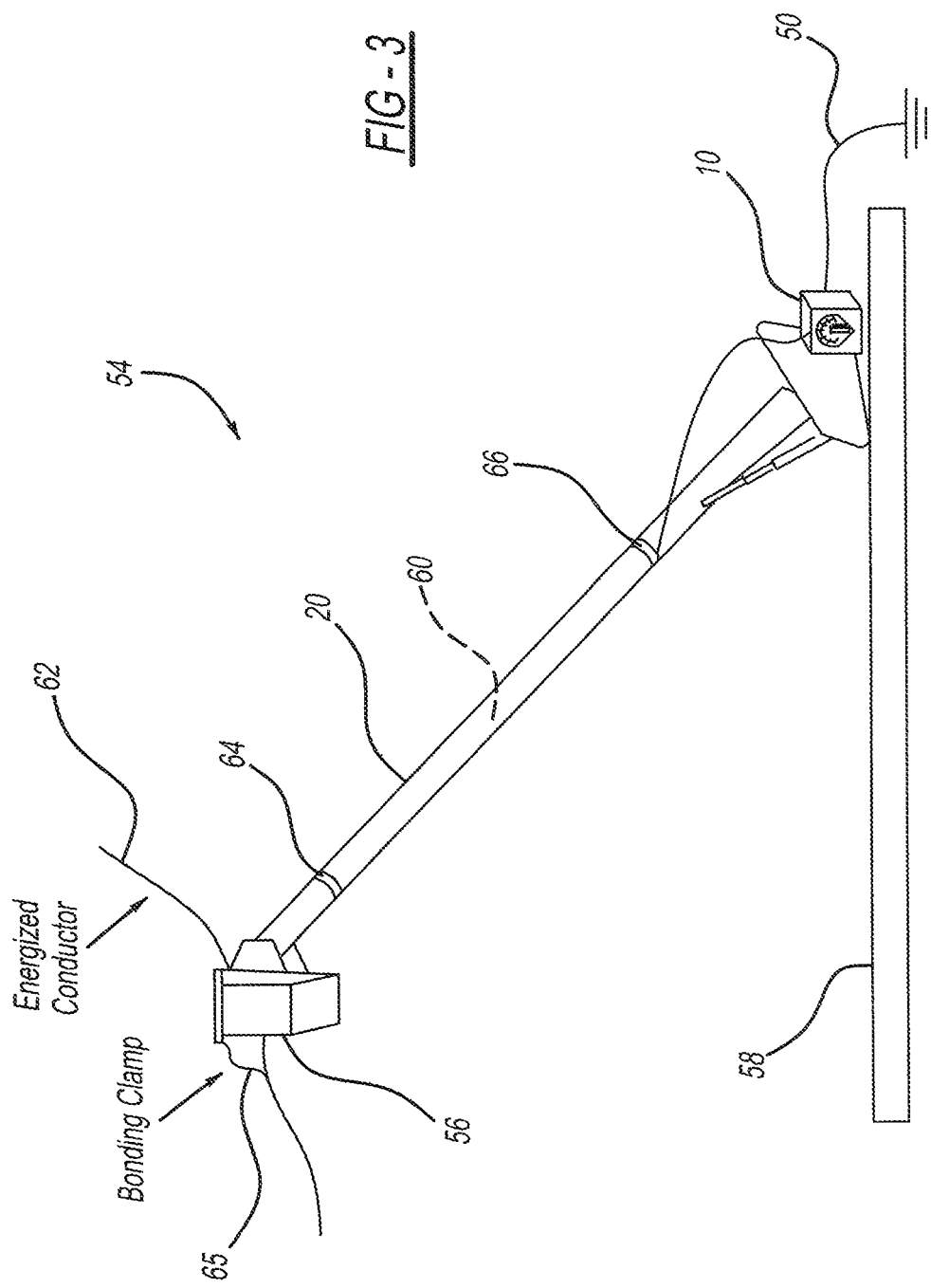
FIG. 3 is a perspective view of a voltage meter located in an example in-use location to monitor direct current that passes through an insulated boom from a direct current voltage line in accordance with teachings of the present invention.

FIG. 3 depicts DC current meter 10 in an in-use position with an aerial lift device 54 equipped with a bucket 56 for human occupants. The aerial lift device 54 may be mounted to a truck, vehicle, or trailer chassis 58, or similar platform, the chassis 58 may or may not have wheels. When DC current meter 10 is in use, a boom 20, which may be a fixed length, or extendable in a telescoping fashion, may be extended such that bucket 56 resides beside an energized (i.e. live) high voltage direct current power line 62 so that human occupants within bucket 56 can perform maintenance on, or further construct, high voltage direct current power line 62. When current meter 10 is in use, bucket 56, which may be constructed with metallic components, is placed at the same potential (i.e. voltage) as DC power line 62. Similarly, a human occupant within bucket 56 is also placed at the same potential as DC power line 62. In order place bucket 56 and any human occupant within the bucket 56 at the same potential as DC power line 62, a bonding clamp 65 is used. Bonding clamp 65 provides an electrical link to bucket 56 and human occupants to achieve a common potential for the DC power line 62, bonding clamp 65 and bucket 56. Bucket 56 is pivotably attached to telescoping boom 20 to permit relative motion between bucket 56 and telescoping boom 20. Telescoping boom 20 is an electrically insulating member made from fiberglass, or fiberglass and other non-conductive materials, which may include plastics and other materials.

Figure 4:
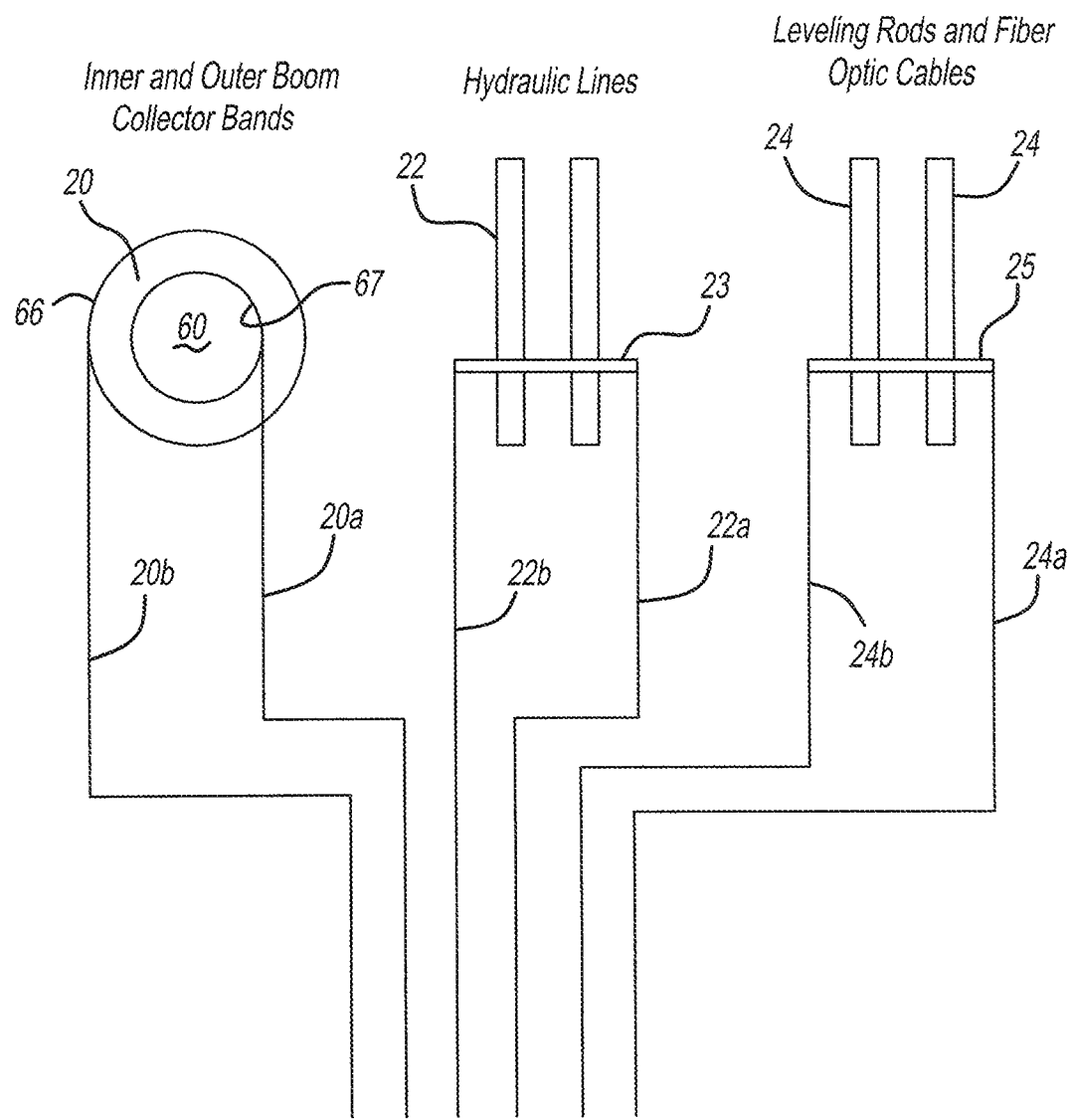
FIG. 4 is a diagram depicting components to which a voltage meter may be electrically connected to monitor voltage in accordance with teachings of the present invention.

Continuing with FIG. 3, mounted to telescoping boom 20 proximate to bucket 56 is a corona ring 64. Corona ring 64 may be mounted within three meters or within three yards of the junction of boom 20 and bucket 56, or where most electrically advantageous. At an opposite end of boom 20, proximate a truck chassis 58, other mounting platform or lowest pivot point of boom 20, an outer collector band 66 and an inner collector band 67 may be mounted to and against, an exterior and an interior, respectively of boom 20. Boom 20 may be hollow and used as a conduit or passageway for components depicted on FIG. 4, such as one or more hydraulic lines 22, electric lines 22a, 22b, and one or more fiber optic cables 24, and electric lines 24a, 24b. As also depicted in FIG. 4, electric lines 20a, 20b are attached to boom 20, and at least electric line 20a may traverse boom interior 60, while electric line 20b may traverse or run along some length of an exterior surface or interior surface of boom 20. At a base of boom 20, an electrical collection point exists for all structures being monitored for current flow, which may be an input for meter 10. Each of hydraulic lines 22, fiber optic cables 24, and boom 20 are made of a dielectric material and have electrical insulating qualities; however, even dielectric and insulating materials will permit some relative quantity of current to pass, and the teachings of the present invention including voltage meter 20, are designed to detect that level of current and alert a user of the invention.

Figure 5:
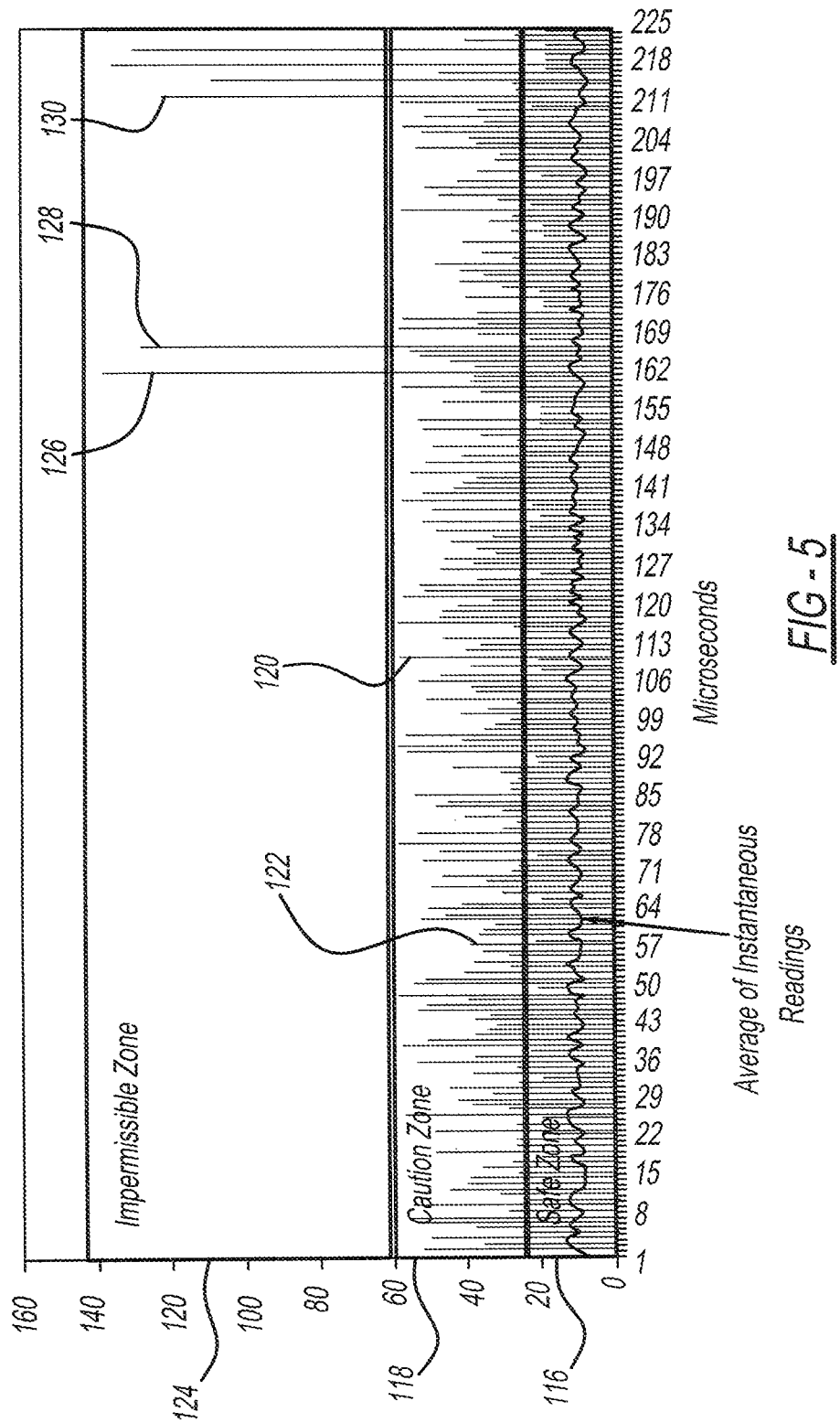
FIG. 5 is a graph of DC current versus time, for a voltage class, showing DC current readings, in an example measuring scenario using the current meter in accordance with teachings of the present invention.

FIG. 5 is a graph of current measurements versus time 68 in an example measuring scenario using current meter 10 in accordance with teachings of the present invention. The zones within the graph of FIG. 5 will be explained later during a presentation of operation of the teachings of the present invention.

Figure 6:
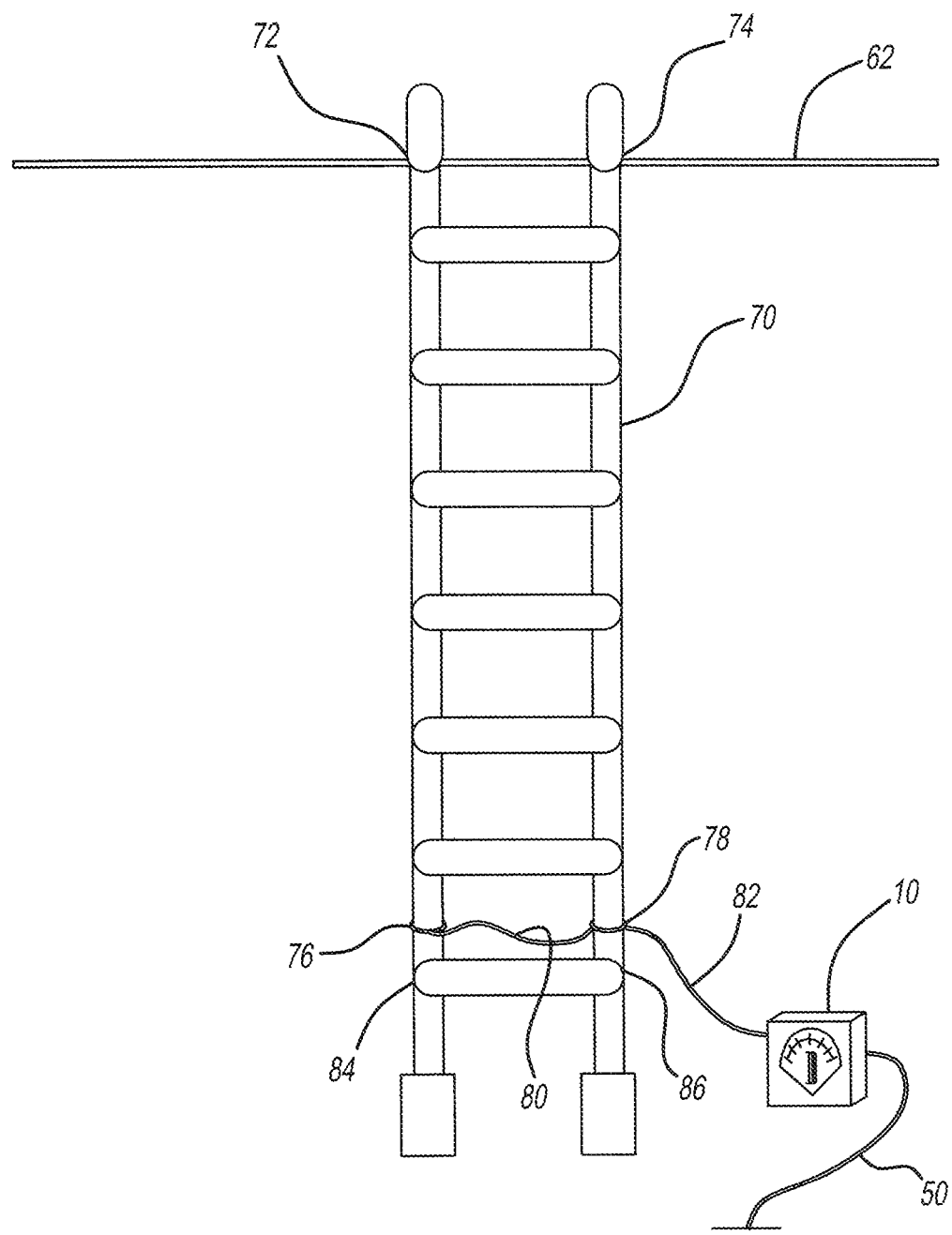
FIG. 6 is a view of an insulating ladder arranged in contact with an energized conductor and a voltage meter, for measuring current passage through the insulating ladder, in accordance with teachings of the present invention.

FIG. 6 depicts an insulating ladder 70 arranged in contact with an energized electrical conductor 62 at contact points 72, 74, and a current meter 10 electrically connected to insulating ladder 70. At the opposite end of insulating ladder 70, a first electrically conductive clamping ring 76 surrounds and contacts a first ladder leg 84, and a second electrically conductive clamping ring 78 surrounds and contacts a second ladder leg 86. A clamp ring jumper wire 80 electrically connects to each of first electrically conductive clamping ring 76 and second electrically conductive clamping ring 78. Although either electrically conductive clamping ring 76, 78 may be used, FIG. 6 depicts a meter lead in wire 82 conduct electricity from each of first electrically conductive clamping ring 76 and second electrically conductive clamping ring 78 and to current meter 10. Current meter 10 is the same current meter 10 depicted in FIG. 1 and FIG. 2, although in the arrangement depicted in FIG. 6, meter lead in wire 80 is a single conductive wire. The arrangement of FIG. 6 permits current meter 10 to detect leakage current passing from DC power line through the insulating ladder and to ground 50.

Figure 7:
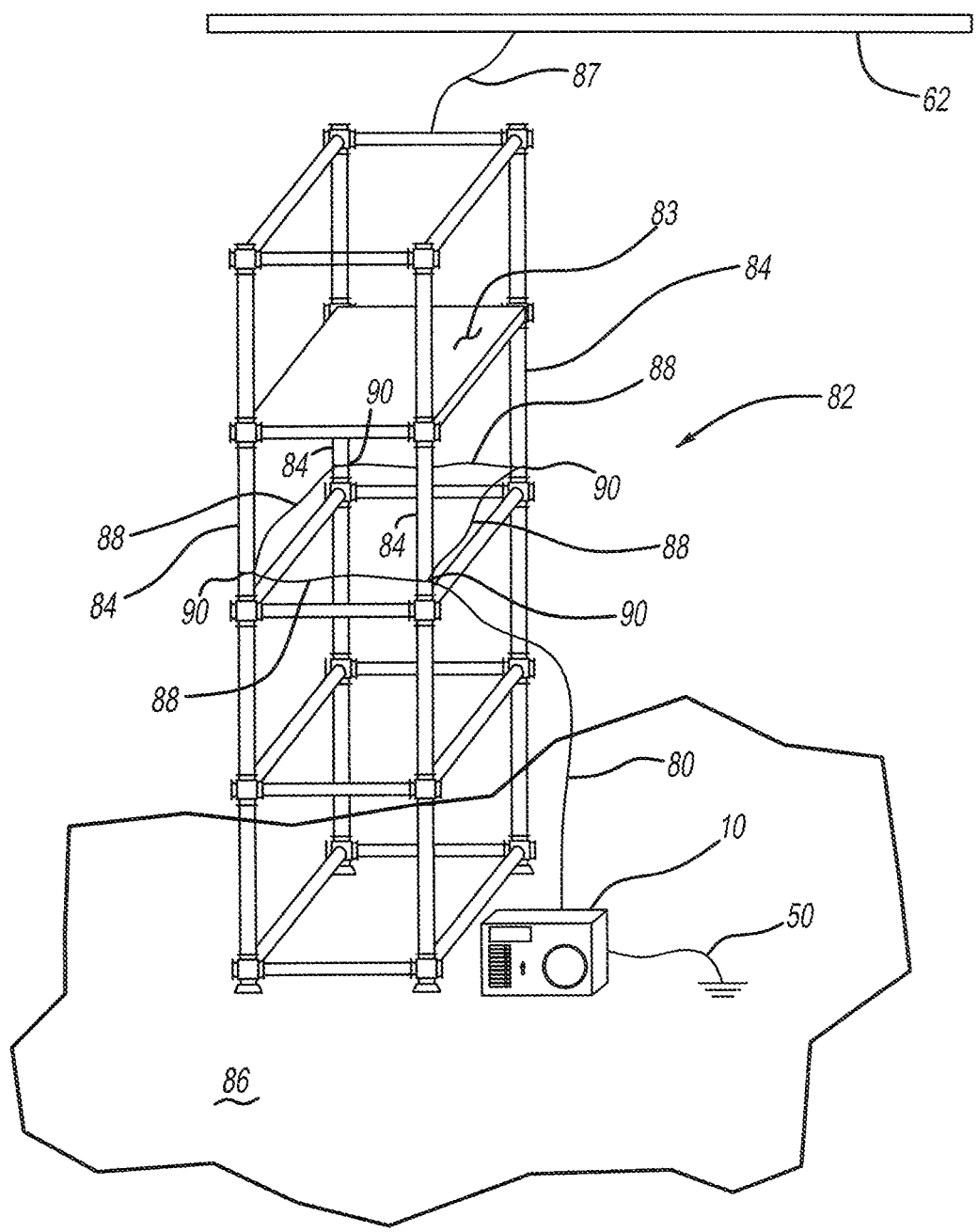
FIG. 7 is a view of insulating scaffolding arranged in contact with an energized conductor and a voltage meter, for measuring current passage through the insulating scaffolding, in accordance with teachings of the present invention.

FIG. 7 depicts another embodiment of the present teachings in which an insulating scaffolding 82 is arranged in physical and electrical contact with an energized DC conductor 62, such as with electrical jumper 87. When a human worker is resident upon horizontal platform 83, DC current meter 10 may be electrically connected to insulating scaffolding 82 to monitor the leakage current through insulating scaffolding 82. More specifically, in a given horizontal plane at some distance from either an Earthen surface 86 upon which insulating scaffolding 82 may reside, or at some distance from energized DC conductor 62, each of vertical posts 84 passing through such horizontal plane are electrically connected with an electrically conductive wire 88 or multiple pieces of electrically conductive wire 88. Electrically conductive wire 88 may be secured against each vertical post 84 by an electrically conductive clamp ring 90 to permit a continuous electrical loop of electrically conductive wire 88, which securely holds electrically conductive clamp ring 90 and electrically conductive wire 88. Thus, a continuous loop from vertical pole to vertical pole around insulating scaffolding 82 is created. From one of electrically conductive wire 88, meter lead in wire is connected to create an electrically conductive link from electrically conductive wire 88 to current meter 10. The arrangement of FIG. 7 will measure DC current passage through the insulating scaffolding and into ground via ground wire 50.

Figure 8:
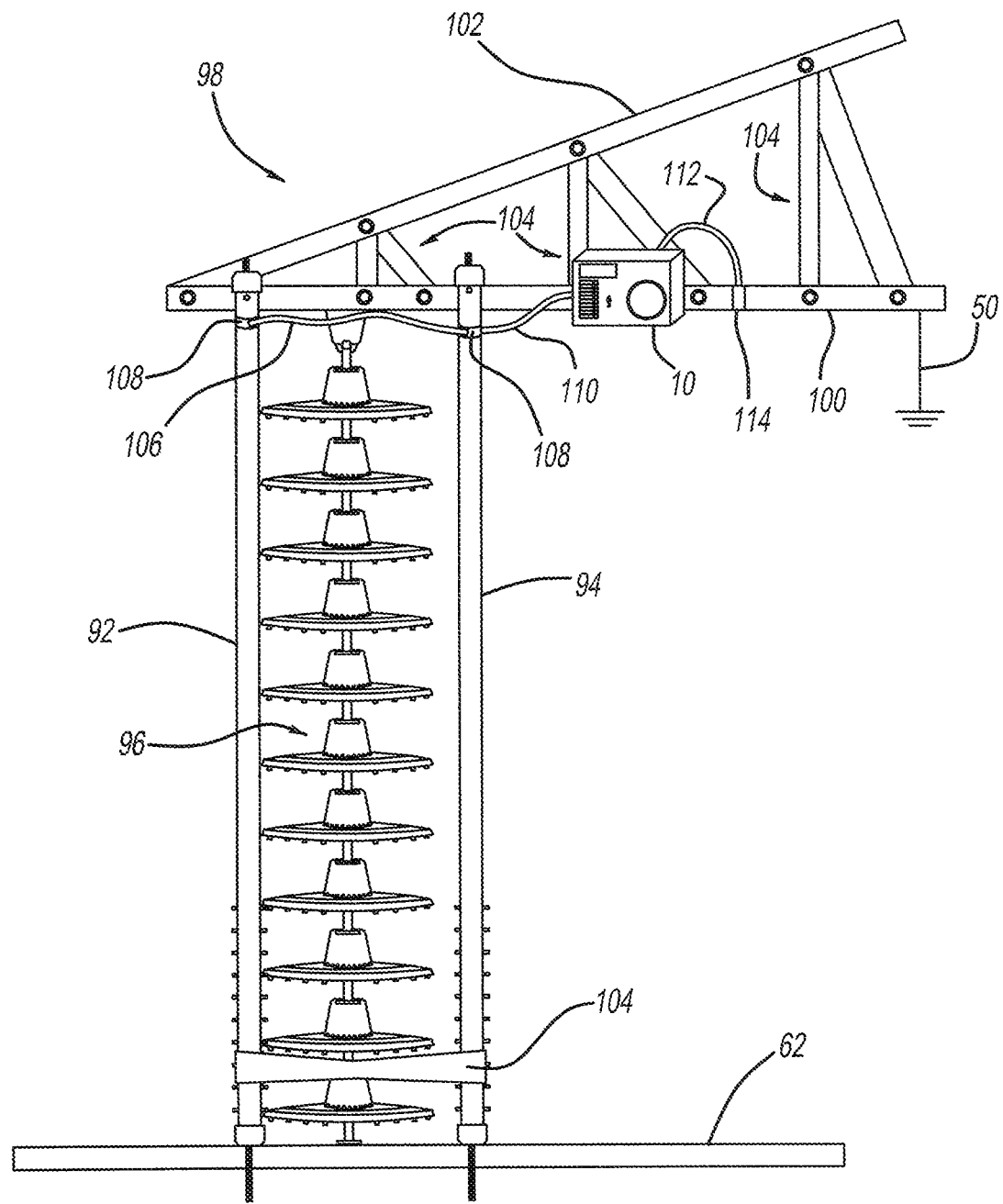
FIG. 8 is a view of an insulating hot stick used during a replacement of an insulator on a power line, in accordance with teachings of the present invention.

FIG. 8 depicts a first insulating hot stick 92 and a second insulating hot stick 94 used during a replacement of an insulator 96 on a DC power line 62, and placement of current meter 10 during use of such replacement, in accordance with teachings of the present invention. A hot stick is a name used by professionals engaged in the trade of maintaining, constructing and reconstructing energized, or live, DC power lines, for specific types of insulated poles, which are also tools, and usually made of fiberglass, or fiberglass and other insulating material(s). The insulating materials prevent, for practical purposes, electrical current from traveling from DC power line 62 to ground 50.

Continuing with FIG. 8, use of current meter 10 during a typical scenario involving replacement of an aged or otherwise compromised insulator 96 may involve a conductor supporting structure 98, such as part of a lattice tower or any powerline supporting structure that is grounded and thus at the potential of ground 50 (i.e. in the industry known as ground potential). As part of conductor supporting structure 98, FIG. 8 depicts an approximately horizontal, or horizontal beam 100, with, relative to horizontal beam 100, an angled beam 102. Horizontal beam 100 and angled beam are joined by connective structures 104 to increase strength. With first insulating hot stick 92 and second insulating hot stick 94 attached to conductor supporting structure 98, such as to horizontal beam 100, first insulating hot stick 92 and second insulating hot stick 94 hang to the same or approximately the same length as insulator 96. First insulating hot stick 92 and second insulating hot stick 94 may be separated at a specified distance by a limiting bracket 104. Each of first insulating hot stick 92 and a second insulating hot stick 94 is affixed to energized DC power line 62 by clamping or some suitable device, and similarly each of first insulating hot stick 92 and a second insulating hot stick 94 is affixed to horizontal beam 100 by clamping or some suitable device. Limiting bracket 104 may be located proximate energized DC power line 62. When first insulating hot stick 92 and second insulating hot stick 94 are in place as depicted in FIG. 8, insulator 96 may be removed and instead of insulator 96, before removal, bearing the tensile load due to gravity of energized DC power line 62, each of first insulating hot stick 92 and second insulating hot stick 94 bears half the tensile load of energized DC power line 62.

In accordance with the present invention, FIG. 8 also depicts current meter 10 affixed in some fashion to conductor supporting structure 98. Additionally, an electrically conductive jumper 106 located between first insulating hot stick 92 and second insulating hot stick 94, creates an electrical path between the two sticks 92, 94. Electrically conductive jumper 106 is securely fastened to each of first insulating hot stick 92 and second insulating hot stick 94 by an electrically conductive clamp 108 that is consistent to each junction. From one of electrically conductive clamp 108 to current meter 10, a meter electrical lead wire 110 permits leakage current to flow to current meter 10. A conductive ground lead 112, clamped to conductor supporting structure 98 with clamp 114, completes an electrical current path via conductor supporting structure 98 to Earth ground 50.

Figure 9:
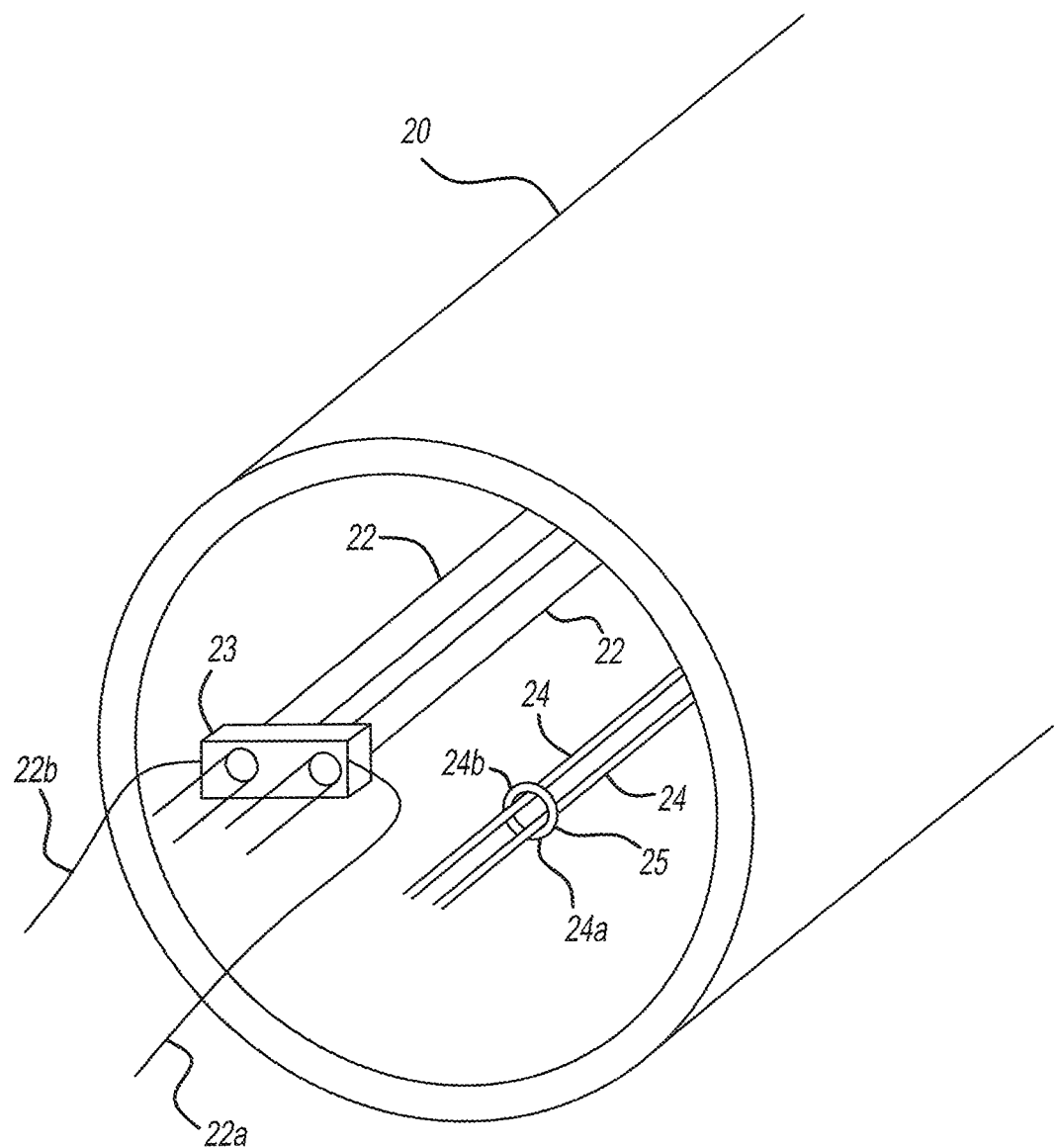
FIG. 9 is an interior view of a boom showing locations of a hydraulic line collector block and a fiber optic conductive clamp.

FIG. 9 is a perspective view of how hydraulic lines 22 and fiber optic cables 24 may reside within boom 20. Additionally, FIG. 9 shows how electric lines 22a, 22b, 24a, 24b may conduct current which is directed to meter 10 as part of the monitoring of any leakage current in accordance with teachings of the present invention. Collector block 23 is electrically conductive and may be the transition point at which hydraulic lines 22 transition from their needing to be insulating part to not needing to be an electrically insulating part. Collector block 23 is electrically conductive and may be the transition point at which fiber optic lines 24 transition from their needing to be an electrically insulating part to not needing to be a an electrically insulating part. FIG. 9 also depicts fiber optic cables 24, which may be gathered with an electrically conductive clamp 25 from which electric lines 24a, 24b transmit current to meter 10. Electrically conductive clamp 25 has dual electric lines 24a, 24b running from it for the same reason that hydraulic collector block 23 has dual electric lines 22a, 22b running from it, which is to easily permit an electrical continuity test from meter 10 (e.g. as another FIG. 1 function button 46) to ensure there are no breaks or interruptions in the electrical continuity of such an electrical circuit.

During one example operation of the present invention, and with initial reference to FIG. 3, when bucket 56 of aerial lift device 54 is electrically bonded to energized DC power line 62, with bonding clamp 65, also a conductive lead, contacting each of energized DC power line 62 and bucket 56, bucket 56 and any human occupants will reach the same potential or voltage as energized DC power line 62. With such an energized arrangement, DC current passing through boom 20, DC current passing through hydraulic lines 22, and DC current passing through fiber optic cables 24, which individually and collectively are referred to as "leakage current" must be monitored as it moves through these structures to ground 50. Current meter 10 will monitor this DC leakage current, as depicted in FIG. 5. FIG. 5, which is an example graph of DC current in microamps versus microseconds, shows leakage current measurements within a specific DC voltage class. DC current measurements may be taken or measured at almost any frequency, such as from 10 measurements per second to 1000 or more measurements per second, and as previously stated, within a particular DC voltage class for a particular energized DC power line 62. All current measurements may be performed by microcontroller 18, or an average current calculated after a predetermined number of measurements, such as after 100 or 1000, or some other quantity, and then stored in a memory such as external memory 44. An average of some quantity of the current measurements may be displayed on graphical display 42, which may be a color display, and on an LCD display 40, which may be a numerical display. Because over time, electrical charge may build on insulating components such as boom 20, hydraulic lines 22 and fiber optic cables 24, and as a result, an average current value for the total of current measurements, or some predetermined quantity of current measurement values, may increase from a first or safe current zone 116 to current zone 118, which may be a caution zone. In caution zone 118, some current measurement values, such as current measurement value 120 are greater than others, such as current measurement value 122. Zone 124 of FIG. 5 depicts a zone of highest current measurement values, which are also know as current spikes and may indicate an instance of, or impending, flash-over. A flashover is an event in which the DC leakage current exceeds the highest permissible value for a particular voltage class.

With continued reference to FIG. 5, zone 124 represents an impermissible zone within which if DC leakage current reaches for a particular voltage class or range, some intervention or preventive steps need to be taken to stop or reduce the amount of leakage current passing to ground 50. Within impermissible zone 124, microamp levels for current measurements 126, 128 and 130 represent the highest levels of leakage current.

A graph such as the graph depicted with FIG. 5, could be plotted for many different pieces of insulating equipment for which leakage current needs to be monitored. For example, as depicted in FIG. 6, the leakage current passing through insulating ladder 70 could be monitored and plotted for a selected voltage class of an energized DC power line 62 if insulating ladder 70 is in contact with energized DC power line 62. Similarly, as depicted in FIG. 7, the leakage current passing through insulating scaffolding could be monitored and plotted for a selected voltage class of an energized DC power line 62 with which insulating scaffolding 82 is in contact.

Alternatively, an array of information could be compiled and stored, such as in a database in memory 44 of meter 10. An array of information may include columns of information including, but not limited to, time (e.g. seconds), amperage reading (e.g. micro amps) at a time interval (e.g. every $1/60$ of a second, every $1/100^{th}$ of a second, every $1/120^{th}$ of a second), and average amperage value for a predetermined number of amperage readings (e.g. every 60 reading, every 100 readings), or over a predetermined time period (e.g. every second, every ten seconds). As an example, an average amperage value for a predetermined number of amperage readings, or an average amperage value over a predetermined time period may be displayed on LCD display 40 or other display, such as display 42, on meter 10 for visual inspection by viewer or user of meter 10. Still yet, instead of displaying a numerical value on a display, a graphical representation may simultaneously be displayed or instead be displayed. A graphical representation may be a continuously changing bar graph that graphically displays an average amperage value for a predetermined number of amperage readings, or an average amperage value over a predetermined time period.

Before presenting details of a process or routine that meter 10, and more specifically microcontroller 18 within meter 10, may employ in accordance with the present teachings, further details on measurement by meter 10 of direct current will be presented. When a fully insulating body is exposed to a voltage source (e.g. either AC or DC) no current will pass through it regardless of the voltage or potential difference experienced by the insulating body. However, in reality a fully insulating body or "perfect insulator" does not exist, and all insulators to some degree respond or perform as resistors and therefore are subject to Ohms law for current passing through the insulating body. This is known as resistive current. Thus, in the present teachings, resistive current is passing through the insulating body, such as insulating boom 20, insulating ladder 70, hot sticks 92, 94, etc. to which meter 10 is connected. In addition to resistive current passing through such insulating bodies, another type of current passes through the insulating bodies. This current is known as capacitive current.

A capacitor in its simplest form is essentially two conductive objects separated by an electrically insulating medium. When DC voltage is applied to one of the conductive objects no current will flow from one object to the other, if the insulating medium is perfectly insulating. Regarding AC voltage (time varying voltage), when voltage is applied to the same capacitor, a displacement current passes through the non-perfectly insulating medium. This "capacitive" effect actually occurs when DC voltage is applied as well and is known as a transient voltage and is a result of the lack of a perfect insulator between the conductive objects and the presence of charge carriers in same. Current, known as momentary current, will flow for a short period of time and then stop as the electrical charge between the energized source and the insulating medium reach parity. However this electrical charge is released when this current flows to ground and the cycle repeats. Comparing the preceding explanation to teachings of the present disclosure, a boom 20 of a bucket truck, or other live line tool such as an insulating ladder 70 is an electrically insulating medium. Conductive objects may be DC power line 62 and ground 50, such as Earth.

With reference to FIG. 3, when bucket 56 is electrically bonded (i.e. at the same electrical potential) to DC power line 62, boom 20, because it is physically connected to bucket 56, will still experience a very small current flow to ground 50. The current flow is the sum of the capacitive and resistive currents explained above. The sum of these two types of current is greater with insulating devices, such as boom 20, used in conjunction with AC voltage/AC current power lines than with DC voltage/DC current power lines. Moreover, measuring DC current, such as with meter 10, is different than measuring AC current, especially when DC voltages range from 70 kV to 500 KV, which may be measured with teachings of the present disclosure. As discovered during testing in conjunction with the present teachings, in direct current situations as the electrical resistance of some insulating materials of insulators begins to degrade or lose their insulating properties, either from contamination or when the voltage applied across an insulator increases relative to the resistance of the insulator, the resistive current will remain relatively unchanged. However, during this time of relatively consistent resistive current, "pulses" or "momentary current spikes" or "short duration spikes," which are increases of capacitive current, which may be many orders of magnitude greater than the relatively stable resistive current, will begin to move through the insulator with increasing intensity and frequency as the resistive threshold (i.e. breakdown) of the insulator is approached. These "pulses" of current may last for only a few milliseconds as they discharge to ground and therefore must be measured in small time intervals by equipment sensitive enough to detect and monitor any pulses. Traditional analog meters or any presently known current measuring devices that display measured current are insufficient at least because an analog needle will not react quickly enough to notify one of impending dielectric breakdown, and a digital LCD display will not register the measured current value and display it for a long enough period of time to be of benefit to a user. Regardless, voltages in the DC voltage range from 70 kV to 500 KV are extraordinarily high for known meters and proper notification of a dielectric failure.

Thus, teachings of the present disclosure may employ an analog to digital converter 16 or other device within meter 10 that is capable of detecting short-lasting current changes for a predetermined number of times in a minute, detecting what that current is, detecting how long each current change or increase lasts, recording them, and displaying such information so that a user can understand what stresses or potential dielectric breakdown a particular insulator is experiencing. The time scale or number of times that a current measurement may be measured may be in the range of 100ths of a second (milliseconds) to 1000ths of a second (microseconds). Durations of an electrical pulse may be in the range from approximately 1/10th of a second to approximately 1/60th of a second. Each current measurement may be in 100ths of an amp (milliamps) to 1000ths of an amp (micro amps), or larger or smaller. In accordance with the present teachings, each current measurement is displayed graphically to allow a user, such as an electrical worker or lineman, to interpret a current measurement, but such measurements are also recorded by the method or process of software within meter 10 by a memory 44, such as a hard drive or similar data memory device. The measurements of current and their duration may be stored in memory 44 of the meter 10 as a series of integers (or values) over a given time period. As measurements of current are recorded by an analog current sensor within ADC 16 and digitally converted, a process or method of software analyzes the current value or reading of the electrical pulses and tracks both, the frequency and intensity. The frequency may be the number of current spikes for a given period of time, and the intensity may be the amplitude or current value. These values are logged (e.g. stored) by the software. The time scale of the frequency of the pulses is not displayed to the worker but is tracked by the software. The worker is only shown the amplitude (the electrical current value) of the pulses. For a voltage of a DC power line 62 applied to a given insulator (e.g. boom 20 of bucket truck, ladder 70, or other live line tool) a known, safe threshold value has been determined through experimentation.

Continuing with FIG. 2, various zones are evident on graphical display 42 to display current values. For example, a safe (e.g. green) level of current is graphically displayed by a series of green bars on the meter with a given value. Such a green zone is predetermined by the DC voltage class (e.g. a DC voltage range) of DC power line 62. Thus, safe zones of measured current by meter 10 will vary based upon the DC voltage range or precise DC voltage of a power line to which meter 10 is connected for measuring current values "leaking" through insulating tools. Thus, any current values or pulses below a predetermined value are shown graphically with green bars on a lighted vertical intensity graph. This could also be displayed through colored lights, a physical graph, or any other graphical display of intensity. Yellow zone (i.e. caution) or red zone (i.e. danger and stop working on DC power line 62) current threshold values are also displayed, but these may be accompanied by an audible or visual warning signal of some type to alert the operator to the presence of increasing intensity of these current pulses. Yellow zone current pulses are of value because changes in the physical positioning of the bucket, insulating properties or momentary voltage increases on DC power line 62 may cause transient current spikes to be measured by meter 10. These must be noted and a user or worker must be alerted to yellow zone current pulses but they do not necessarily constitute a dangerous situation. Red zone current pulses indicate that a safe current threshold of the insulation integrity has been exceeded or is imminent and any workers must remove themselves or the live line tool (e.g. boom 20) from the energized source, such as DC power line 62. Any red zone current pulses would be several orders of magnitude below the actual flashover threshold of the insulating live line tool (e.g. boom 20) to provide additional warning time and an adequate safety factor. A flashover is a dielectric failure of a device such as an insulating live line tool (e.g. boom 20) that can also be thought of as the creation of an instantaneous conductive path for discharge of current, or electrons, through the insulated device.

Because of the relatively large quantities of data the software will generate, in the form of current measurements or calculations, any "old" recorded and displayed current spikes may be constantly deleted from the memory in order to provide the user or worker with newer, more relevant data as to the present or instantaneous insulating properties or condition of an insulating live line tool (e.g. boom 20). As an example, a timescale of one minute may be used such that the software would count the current spikes for a given value of time, say 100 recorded current values per second, or 6,000 per minute. As the meter continues operation for however many minutes or hours the meter is employed for a given time of monitoring current, the oldest values of current measured or recorded may be deleted and the graphical display may be reset to show the corresponding lack of incidents, in the current time scale.

As an example, at time 1, which may be a first measurement of a current through a boom 20 or other live line tool, a yellow zone current measurement was recorded and displayed on the graphical display. Subsequently, the next 6,000 instances of current measurements through the boom 20 or other live line tool, no other yellow zone current spikes are measured. As a result, the software may be written to delete the 6000 measurements, and the measurement at time 1, from memory 44. Moreover, the corresponding graphical representation on graphical display 42 of this current spike may be removed. If results are being displayed on LCD display 40 in a continuous fashion, such display on LCD display 40 may be removed. With memory deleted, the process may begin again. Memory 44 may be used to plot graphs of current measurements over time for specific DC voltages and each of the variety of insulating devices with which meter 10 will be used. Alternatively, no memory may be utilized, and one or more of graphical display 42, LCD display 40, and an audible alarm for a yellow zone or red zone event may be utilized.

Figure 10:
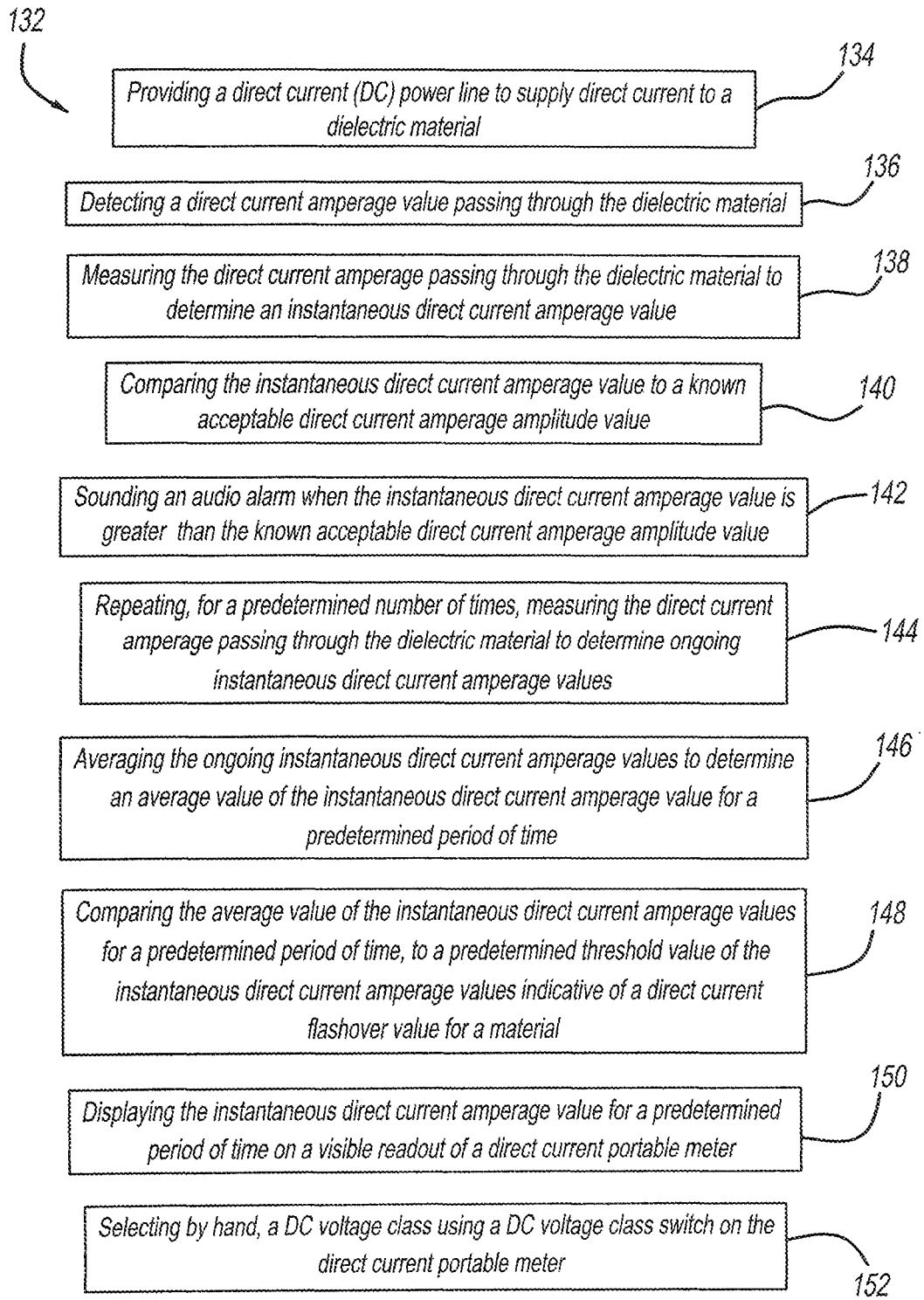
FIG. 10 is a flowchart of a routine controlled by software within microcontroller to monitor current through an insulating body, in accordance with teachings of the present invention.

FIG. 10 depicts a flowchart 132 of an example routine controlled by software within microcontroller 18, for example, to monitor current through an insulating body such as boom 20, hot stick 92, 94, or ladder 70, as examples, using meter 10 in accordance with the present teachings. What is being monitored by the routine of flowchart 132 is the flow of current, such as capacitive current. At step 134, the routine may include providing a direct current (DC) power line to supply direct current to a dielectric material. At step 136, the routine may include detecting a direct current amperage value passing through the dielectric material. At step 138, the routine may include measuring the direct current amperage passing through the dielectric material to determine an instantaneous direct current amperage value. At step 140, the routine may include comparing the instantaneous direct current amperage value to a known acceptable direct current amperage amplitude value. At step 142, the routine may include sounding an audio alarm when the instantaneous direct current amperage value is greater than the known acceptable direct current amperage amplitude value. At step 144, the routine may include repeating, for a predetermined number of times, measuring the direct current amperage passing through the dielectric material to determine ongoing instantaneous direct current amperage values. At step 146, the routine may include averaging the ongoing instantaneous direct current amperage values to determine an average value of the instantaneous direct current amperage value for a predetermined period of time. At step 148, the routine may include comparing the average value of the instantaneous direct current amperage values for a predetermined period of time, to a predetermined threshold value of the instantaneous direct current amperage values indicative of a direct current flashover value for the material. At step 150, the routine may include displaying the instantaneous direct current amperage value for a predetermined period of time on a visible readout of a direct current portable meter. At step 152, the routine may include selecting by hand, a DC voltage class using a DC voltage class switch on the direct current portable meter. Additional steps of the routine of flowchart 132 are envisioned, including intervening steps of those steps depicted in FIG. 10.

The discussion of any reference is not an admission that it is prior art to the present invention, especially any reference that may have a publication date after the priority date of this application. At the same time, each and every claim below is hereby incorporated into this detailed description or specification as an additional embodiment(s) of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. An apparatus for monitoring DC current from an energized DC electrical power line during maintenance to said power line, wherein during said maintenance an aerial lift platform is operatively coupled to at least said power line, the apparatus comprising:
   a DC current measuring device connectable in series between the aerial lift platform and an earth ground during said maintenance to measure a momentary DC leakage current value from the energized DC electrical power line for each of a plurality of millisecond or smaller time intervals;
   a digital memory to store said measured momentary leakage current values measured by the DC current measuring device,
   wherein the apparatus is arranged to compare said measured momentary leakage current values stored in said digital memory to a predetermined threshold current value indicative of a DC current flashover current value for the aerial lift platform.

2. The apparatus of claim 1, further comprising:
   a DC numerical display arranged to display the DC leakage current measured by the DC current measuring device; and
   an audio alarm arranged to sound upon the DC current measuring device measuring a threshold DC current value.

3. The apparatus of claim 2, wherein the apparatus is arranged to:
   calculate a moving average for said measured momentary leakage current values;
   compare the moving average to the predetermined threshold current value; and
   sound the audio alarm when the moving average is larger than the predetermined threshold current value.

4. The apparatus of claim 1, further comprising:
   a manual DC voltage class selector switch that is manually adjustable to coincide with a DC voltage of the DC electrical power line.

5. The apparatus of claim 1, further comprising:
   an automatic DC voltage class selector switch that automatically switches to coincide with a DC voltage of the DC electrical power line.

6. The apparatus of claim 1, further comprising:
   a graphical display arranged to visually depict a level of the DC leakage current measured by the DC current measuring device.

7. The apparatus of claim 1, further comprising:
   an electrical input collector connectable to the aerial lift platform;
   an analog front end arranged to measure amperage flowing from the aerial lift platform via the electrical input collector; and,
   an analog to digital converter connecting the analog front end to a microcontroller and being arranged to convert an analog measurement from the analog front end to a digital representation for processing by the microcontroller.

8. The apparatus of claim 7, wherein the analog front end comprises:
   one or more shunt resistors creating a path to the earth ground;
   one or more high bandwidth and high gain amplifiers arranged to measure potential difference across the one or more shunt resistors with reference to ground earth, the potential difference corresponding to a leakage current.

9. The apparatus of claim 8, wherein the one or more high bandwidth and high gain amplifiers are configured for bi-directional leakage current detection for a scale of +/−0 to 500 microamperes range.

10. The apparatus of claim 8, wherein the one or more high bandwidth and high gain amplifiers are configured for single-ended leakage current detection for a scale of +/−0 to 1000 microamperes range.

11. The apparatus of claim 7, wherein the analog front end comprises:
    a Hall effect sensor arranged proximate to an electrical circuit component of the analog front end with a connection to the earth ground, the Hall effect sensor being arranged to detect a magnetic field of the electrical circuit component, the magnetic field corresponding to a leakage current.

12. A method for monitoring DC current from an energized DC electrical power line during maintenance to said power line, wherein during said maintenance an aerial lift platform is operatively coupled to at least said power line, the method comprising:
    connecting a DC current measuring device in series between the aerial lift platform and an earth ground during said maintenance;

measuring, by said DC current measuring device, a momentary DC leakage current value from the energized DC electrical power line for each of a plurality of at least millisecond time intervals;

storing said measured momentary leakage current values measured by the DC current measuring device as data in a digital memory; and, comparing said measured momentary leakage current values stored in said digital memory to a predetermined threshold current value indicative of a DC current flashover current value for the aerial lift platform.

13. The method of claim 12, wherein the step of measuring further comprises:
measuring every $1/60^{th}$ of a second, the DC momentary leakage current.

14. The method of claim 12, wherein the step of measuring further comprises:
measuring every $1/120^{th}$ of a second, the DC momentary leakage current.

15. The method of claim 12, further comprising:
sounding an audible alarm when any of said measured momentary leakage current values measured by the DC current measuring device is larger than the predetermined threshold current value.

16. The method of claim 12, further comprising:
activating a visible alarm when any of said measured momentary leakage current values measured by the DC current measuring device is larger than the predetermined threshold current value.

17. The method of claim 12, further comprising:
calculating a moving average for said measured momentary leakage current values;
comparing the moving average to a predetermined threshold current value indicative of a DC current flashover current value for the aerial lift platform; and
sounding an audible alarm when the moving average of said measured momentary leakage current values measured by the DC current measuring device is larger than the predetermined threshold current value.

18. The method of claim 17, wherein the step of calculating a moving average for said measured momentary leakage current values further comprises:
calculating a moving average using a predetermined number of momentary leakage current values measured in succession by the DC current measuring device by excluding the first momentary leakage current value of a series of momentary leakage current values and including the next momentary leakage current value following an immediately prior subset of momentary leakage current values used to calculate an average.

19. The method of claim 12, wherein the step of storing comprises storing said measured current values having up to a predetermined age in the digital memory and deleting said data over said predetermined age.

\* \* \* \* \*